(12) United States Patent
Haupt

(10) Patent No.: US 7,157,327 B2
(45) Date of Patent: Jan. 2, 2007

(54) VOID FREE, SILICON FILLED TRENCHES IN SEMICONDUCTORS

(75) Inventor: Moritz Haupt, Dresden (DE)

(73) Assignee: Infineon Technologies AG, Munich (DE)

(*) Notice: Subject to any disclaimer, the term of this patent is extended or adjusted under 35 U.S.C. 154(b) by 232 days.

(21) Appl. No.: 10/882,752

(22) Filed: Jul. 1, 2004

(65) Prior Publication Data

US 2006/0003523 A1    Jan. 5, 2006

(51) Int. Cl.
*H01L 21/8242* (2006.01)
(52) U.S. Cl. .................. 438/243; 257/E21.588

(58) Field of Classification Search .................. 438/243
See application file for complete search history.

(56) References Cited

U.S. PATENT DOCUMENTS

| 5,888,876 | A * | 3/1999 | Shiozawa et al. ............ 438/386 |
| 6,495,294 | B1 * | 12/2002 | Yamauchi et al. .......... 438/597 |
| 6,552,380 | B1 * | 4/2003 | Sato et al. .................. 257/301 |

* cited by examiner

*Primary Examiner*—Chandra Chaudhari
(74) *Attorney, Agent, or Firm*—Slater & Matsil, L.L.P.

(57) ABSTRACT

The present invention provides methods of producing substantially void-free trench structures. After deposition of an a-Si or polysilicon layer in a trench formed in a semiconductor, the a-Si or polysilicon is exposed to hydrogen at an elevated temperature.

23 Claims, 2 Drawing Sheets

VOID FREE, SILICON FILLED TRENCHES IN SEMICONDUCTORS

BACKGROUND OF THE INVENTION

The present invention relates to semiconductor devices, and, more particularly, void-free, silicon filled trenches in semiconductors.

Semiconductor devices are employed in various systems for a wide variety of applications. Device fabrication typically involves a series of process steps including layering materials on a semiconductor substrate wafer, patterning and etching one or more of the material layers, doping selected layers and cleaning the wafer.

Semiconductor manufacturers continually seek new ways to improve performance, decrease cost and increase capacity of semiconductor devices. Capacity and cost improvements may be achieved by shrinking device size. For example, in the case of a dynamic random access memory ("DRAM") chip, more memory cells can fit onto the chip by reducing the size of memory cell components such as capacitors and transistors. The size reduction results in greater memory capacity for the chip. Cost reduction is achieved through economies of scale. Unfortunately, performance can suffer when device component size is reduced. Therefore, it is a challenge to balance performance with other manufacturing constraints.

One method of shrinking device size is to vertically construct the components, either in a stack over the semiconductor substrate or within the substrate itself. One way to accomplish such vertical construction within the substrate involves forming a trench in the substrate. By way of example only, a capacitor may be fabricated within a trench. Such a capacitor is known as a "trench capacitor."

The capacitor stores charge and includes a pair of electrodes separated by a dielectric material. The charge can represent a data value for use in a memory cell, such as a DRAM cell. While it is desirable to shrink the surface area of a trench capacitor to increase memory cell density, the trench capacitor must be able to store a sufficient amount of charge. For example, regardless of size, a trench capacitor of a DRAM cell typically requires a charge on the order of 25–30 fF (femto Farads). Therefore, it is imperative that trench capacitors be able to store sufficient charge. This may be accomplished by creating trenches which extend relatively deep into the substrate.

A conventional trench capacitor is typically formed as follows. First, a trench is etched in the substrate. The trench has sidewalls defined by surrounding portions of the substrate. Then, an outer electrode, a "buried plate," is formed by implanting a dopant in the substrate surrounding the trench. Next, a dielectric liner, the "node dielectric," is formed along the sidewalls, covering the outer electrode. Subsequently, an inner electrode is deposited within the trench. The inner electrode typically consists of amorphous silicon or polycrystalline silicon, and "a-Si or polysilicon" or "poly-Si", respectively. Amorphous silicon does not have a long range crystalline structure, and a-Si or polysilicon has a semicrystalline structure. From a processing point of view, the electrode may be deposited in form of an amorphous film and, by applying a high temperature in subsequent processing, the amorphous silicon may undergo a phase transition to a poly crystalline state.

In conventional processing, the trench is formed relatively deep within the substrate. For example, a "deep trench" may extend between 4–8 μm below the substrate surface at a given stage in the fabrication process. Deep trenches are typically high aspect ratio trenches. The "aspect ratio" is the ratio of the depth of a trench compared to the width of the opening at the top of the trench. By way of example only, high aspect ratio trenches in advanced semiconductor manufacturing may have an aspect ratio of between 20:1 and 60:1 or higher.

A high aspect ratio trench adversely impacts formation of the inner electrode. This is so because of how the inner electrode is formed. The amorphous-Si (a-Si) or polycrystalline (poly-Si) inner electrode is formed by a deposition process such as chemical vapor deposition ("CVD"). For example, a low pressure CVD (LPCVD) process may be used, wherein the pressure is below 1.5 Torr. During deposition, the a-Si or poly-Si grows inward from the sidewalls. However, this process typically creates voids, gaps or seams within a central portion of the inner electrode. In particular, a V-shaped void may form in a central portion of the inner electrode, which will be described in more detail below.

FIG. 1 shows a trench 6 formed in a substrate 1. Creating a trench having a tapered top portion 7 as shown in FIG. 1 can reduce void formation, because the tapered top allows the deposition process to better access to the trench, resulting in a more complete fill. Generally, increasing the taper angle, e.g., widening the trench opening, reduces void formation. However, larger taper adversely affects the "effective" trench depth (i.e., the depth of the trench excluding the tapered portion).

Etching through the a-Si or poly-Si will typically result in exposure of the void. Typically, the void can be healed by depositing poly-Si into the void after the collar oxide is formed. However, large voids often cause problems such as poor depth control of the healing deposition process. As such, the deposition of poly-Si within long voids running substantially the depth of the trench may not sufficiently heal the defect.

Thus, new methods of formation void free trenches and a-Si or polysilicon inner electrodes are desired. The methods should minimize or eliminate void formation in filled trench structures. Improved methods of healing pre-existing voids are also desired.

SUMMARY OF THE INVENTION

One or more embodiments of the present invention provide methods of forming substantially void free trench structures in semiconductor devices. In accordance with one embodiment of the present invention, a method of fabricating a semiconductor device is provided. The method of this embodiment comprises forming a trench having sidewalls in a semiconductor substrate, depositing a layer of amorphous (a-Si) or polysilicon in the trench, and annealing the a-Si or polysilicon layer in a hydrogen atmosphere to collapse any voids in the trench. Preferably, the annealing avoids recrystallization of a-Si or polysilicon in the sidewalls. According to one or more embodiments, the trenches are high aspect ratio trenches, for examples trenches having an aspect ratio greater than about 20.

In preferred embodiments, the annealing is performed at a temperature elevated from the temperature at which deposition of the a-Si or polysilicon occurs. For example, the annealing may be performed at a temperature greater than about 800° C. In preferred embodiments, the annealing is performed at a temperature between about 850° C. to 950° C.

According to one aspect of the invention, the annealing is performed for a brief period of time, and for a time sufficient to avoid recrystallization of the a-Si or polysilicon. Preferably, this is achieved by performing the annealing for less than about 5 minutes, and more preferably between about 10 seconds and 3 minutes. According to one or more embodiments, the annealing is performed in an environment of flowing hydrogen. The hydrogen is flowed at a rate of between about 2 SLPM and 15 SLPM.

The annealing can be performed in any suitable apparatus for processing of semiconductor devices. Examples of suitable devices for performing the annealing include, but are not limited to, an epitaxy reactor and a rapid thermal annealing reactor.

The methods of the present invention can be used for a variety of semiconductor manufacturing techniques. According to one or more embodiments of the invention, the method can be used to form an electrode in a semiconductor device. According to these embodiments, an outer electrode is formed in a semiconductor substrate, a layer of a-Si or polysilicon is deposited in a trench formed in the semiconductor substrate to form an inner electrode, and the a-Si or polysilicon to flowing hydrogen for less than about 5 minutes at a temperature elevated above the temperature at which the a-Si or polysilicon layer was deposited.

The above features of the present invention will be more fully described and understood with reference to the following detailed description of the preferred embodiments of the present invention, when considered in conjunction with the accompanying drawings.

Figure 1:
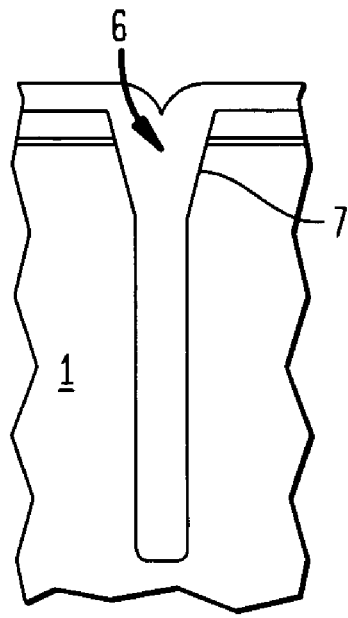
FIG. 1 is a schematic cross-sectional view illustrating a step in a process of forming a tapered, high aspect ratio structure according to the prior art.

The foregoing aspects and features of the present invention will be further appreciated when considered with reference to the following description of the preferred embodiments and accompanying drawings.

DETAILED DESCRIPTION

It is to be appreciated that the various process parameters described herein (by way of example only, temperature, time and pressure) are approximations and may be varied, and certain steps may be performed in different order. Before describing several exemplary embodiments of the invention, it is to be understood that the invention is not limited to the details of construction or process steps set forth in the following description. The invention is capable of other embodiments and of being practiced or carried out in various ways.

Like reference numerals have been used whenever possible to designate like components in the various embodiments of the present invention. Thus, in certain embodiments, various components or features may be designated by different reference numerals, while similar components and features will be designated by the same reference numerals.

In accordance with an embodiment of the present invention, a method of producing substantially void-free, a-Si or polysilicon filled trench is provided. The method includes forming a trench in a semiconductor substrate, filling the trench with a-Si or polysilicon, and heating the a-Si or polysilicon in a hydrogen environment. The materials and processes described below can be employed in this and other embodiments with various kinds of substrates, including, but not limited to silicon (Si), gallium arsenide (GaAs), indium phosphide (InP) and silicon carbide (SiC). It is to be appreciated that the process parameters, for example, temperature, pressure and time, are approximations and may be varied, and that certain process steps may be performed in a different order than described herein.

Figure 2:
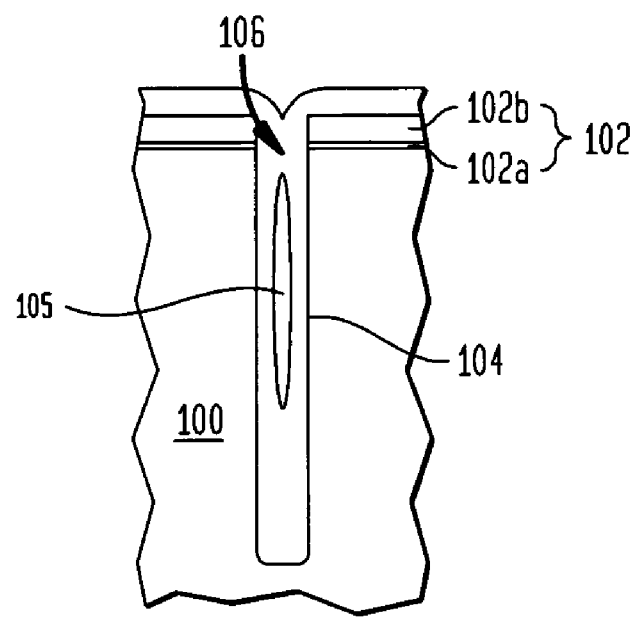
FIG. 2 is a schematic cross-sectional view illustrating a step in a process that results in forming a void in an a-Si or polysilicon filled trench.

FIG. 2 illustrates a cross-sectional view of a step in a process of fabricating a trench capacitor 130. Methods of forming trenches in semiconductor substrates are known to those skilled in the art. One example of a method of forming a trench in a semiconductor substrate may be performed as follows. A pad stack 102 may be formed on top of the substrate 100. The pad stack 102 may comprise one or more material layers. For example, the pad stack may include a pad oxide 102a and a pad nitride 102b that are deposited over the substrate 100. A layer of borosilicate glass (BSG) or tetra-ethyl ortho silicate (TEOS) (not shown) may be formed over the pad oxide 102a and the pad nitride 102b.

A trench 106 can then be formed by using known trench forming techniques. For example, the trench may be formed by an etching process, such as, for example, reactive ion etching ("RIE") or an equivalent process, as is known in the art. After the trench 106 is etched, if a BSG layer is present, it may be removed using techniques known in the art. Trench sidewalls 104 extend through the pad stack 102 into the substrate 100. The trench 106 is preferably a high aspect ratio trench. As used herein, high aspect ratio trench means a trench having an aspect ratio (ratio of trench depth to trench width) greater than 20. As shown in FIG. 2, the trench 106 is a vertical trench. Although not shown in FIG. 2, trench 106 may also include a tapered top portion similar to that shown in FIG. 1. It should be noted, however, that a larger taper may adversely affect the "effective" trench depth (i.e., the depth of the trench excluding the tapered portion). It will be understood that any suitable trench shape may be provided according to the present invention. By way of example only, the lower portion of the trench 106 may have a bottle shape, and the upper portion may or may not be tapered. The trench 106 may also include a void 105 formed therein.

Figure 3:
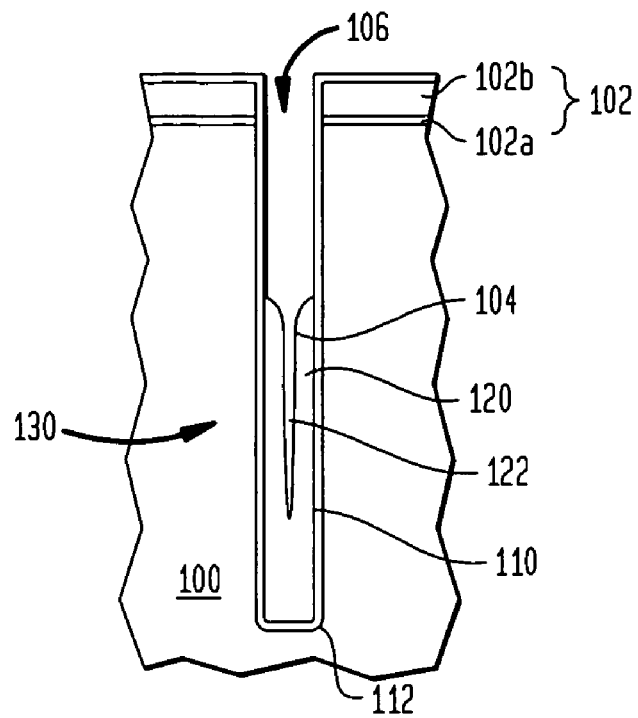
FIG. 3 is a schematic cross-sectional view illustrating a step in a process that results in forming a void in a trench fill material.

Referring to FIG. 3, which illustrates a conventional deep trench or high aspect ratio structure 130 having a V-shaped void 122, the sidewalls 104 of the trench 106 extend through the pad stack 102 into the substrate 100. At least a portion of the sidewalls 104 is covered with a node dielectric 110. An outer dielectric 112 is formed within the substrate 100 adjacent to the node dielectric 110. An inner electrode 120 of a-Si or polysilicon (poly-Si) is formed within the trench 106. As mentioned above, conventional deposition of the a-Si or poly-Si typically produces the void 122 (or gap or seam) within the inner electrode 120. The void 122 increases the resistance of the trench capacitor 130, which can adversely affect its performance. Furthermore, the void 122 typically increases the difficulty of later processing of the conventional trench capacitor 130, especially prior to the deposition of the isolating collar oxide the void prevents the complete recessing of the collar oxide bottom part. For example, the poly-Si within the trench 106 may be recessed or etched back to a desired depth below the surface of the substrate 100. The void 122 may render this recessing step unpredictable in terms of a variety of processing conditions, for example, etch rate, depth and width. The etching/recessing could leave a prominent "V" shape at the bottom of the recessed trench. Then, when a collar (not shown) is deposited, it could be deposited in the void. Subsequent processing would not remove oxide that remains in the void, which leads to increased contact resistance between the layers of poly-Si deposited to form the inner electrode 120. Furthermore, the presence of the void 122 may create a non-planar surface for the inner electrode 120, thereby affecting later fabrication steps.

According to one or mare embodiments of the invention that involve formation of an electrode in a semiconductor substrate, a buried outer electrode 112 is preferably formed around the trench by implanting a dopant into the portion of the substrate 100 surrounding the sidewalls 104 in the lower portion of the trench. A node dielectric 110 is then formed along the sidewalls 104 in the lower portion of the trench. The node dielectric 110 may be selected from a variety of dielectric materials, although the node dielectric 110 preferably has a dielectric constant of at least 3.9, the dielectric constant of silicon dioxide.

After the buried outer electrode 112 and the node dielectric 110 have been formed, the deep trench electrode is formed or deposited along the sidewalls 104, preferably covering the node dielectric 110 to provide an inner dielectric layer. For the formation of the electrode the deposition step preferably comprises a layer sequence of doped a-Si or poly-Si, although other suitable fill materials may be used. The electrode or deep trench fill is preferably deposited using a LPCVD or CVD process. In one example, the LPCVD batch reactor process is performed at a temperature between about 500° C. and 600° C. and the pressure between about 100 and 1500 mTorr. Most preferably, the temperature is between about 500° C. and 550° C. and a pressure of between about 100 and 1000 mTorr. For a deposition process utilizing a conventional single wafer reactor, the process conditions are in the range between 550° C. and 600° C. at pressures between 80 and 300 Torr.

It is preferred that the deposition process is conformal in nature and results in a high percentage (preferably 100%) step coverage. Deep trench processes typically utilize a deposition, which includes incorporation of arsenic or phosphor into the layers to provide low sheet resistance. Therefore, preferably, at least a portion of the deposition process includes exposure to arsenic by flowing $AsH_4$ at about 50 sccm. In addition, $SiH_4$ is flowed at a rate of about 120 sccm during deposition. Process temperature and pressure remain the same to avoid additional stabilization times for the process sequence. The growth rate is approximately 8–11 Å per minute. The layer structure of the a-Si or poly-Si film 114 is preferably between 200–300 nm thick. The deep trench high aspect ratio structure will be completely filled after this step.

After the inner electrode has been formed, it maybe planarized and/or etched back or otherwise recessed within the trench 106 to a desired depth, e.g., to a point above or below a collar in an upper portion of the sidewalls (not shown). Here, after the recessing of the a-Si or poly-Si, the high temperature anneal is applied to close the void in the electrode through silicon material transport. Then, the fabrication process may continue in a conventional manner by, for example, etching back of the node dielectric in the upper part of the deep trench and forming the collar oxide (not shown) within the "void free" recessed trench 106. The collar (not shown) should be structured and the deep trench then subsequently filled with a-Si or poly-Si to form the void free trench capacitor 130.

After formation of the a-Si or poly-Si electrode, an undesired native oxide may be naturally formed over its surface when exposed to ambient air. The native oxide may be removed using buffered hydrofluoric acid (BHF) or dilute hydrofluoric acid (DHF) as is known in the art. An ozone treatment may be employed to remove any residues remaining on the sidewalls 104. The ozone treatment may be performed prior to BHF or DHF etching. One example of an ozone treatment employs 10 ppm of ozone dissolved in DI water.

In accordance with one or more embodiments of the present invention, unwanted voids in a-Si or polysilicon filled trench structures may be eliminated in an annealing process. The annealing process may be performed using conventional semiconductor processing equipment such as epitaxy equipment or a rapid thermal CVD ("RTCVD") process. RTCVD is a conventional CVD process performed at a high temperature to achieve rapid processing. Such equipment is desirable to use due to high temperature capability and high temperature ramp rates. Conventional processing equipment such as a Low Pressure Chemical Vapor Deposition (LPCVD) apparatus could be modified to meet high throughput and low cost manufacturing requirements. According to the present invention, an inner electrode can be formed while substantially or entirely eliminating V-shaped voids therein. Optionally, a dopant may be added during the growth process either in layered deposition steps or through a in situ doping method. The result is a low resistivity inner electrode.

FIG. 3 thus illustrates a cross-sectional view of a step in a process of forming a trench capacitor 130 and eliminating a V-shaped void 122 therein. At this stage of fabrication, the trench 106 has been formed. The trench 106 has sidewalls 104 which extend through a pad stack 102 into the substrate 100. The pad stack 102 may comprise a pad oxide 102a and a pad nitride 102b. At this step in the fabrication process, the trench capacitor 130 includes a buried inner electrode 120 and a node dielectric 110.

As illustrated in FIG. 3, the void 122 within an inner electrode 120 has been exposed during, for example an a-Si or poly-Si recess process. The inner electrode 120 is preferably poly-Si after high temperature annealing. The collar is not materially affected by the processing of the present embodiment.

According to one or more embodiments of the invention, the V-shaped void 122 shown in FIG. 3 can be eliminated by a high temperature annealing process. Preferably, the annealing process uses a temperature that exceeds the temperature at which the polysilicon or amorphous silicon was deposited. A suitable temperature for performing the annealing process is greater than about 800° C., and more preferably, the annealing takes place at a temperature of between about 850° C. to 950° C.

In one or more embodiments, the annealing is preferably performed in a hydrogen environment. A hydrogen rich environment can be achieved by flowing hydrogen during the annealing process at a flow rate of between about 2 SLPM and 25 SLPM. The pressure of the chamber during annealing is preferably between about 10 Torr and 100 Torr. The annealing is preferably carried out for a brief period of time, for example, less than ten minutes, and preferably less than 5 minutes. More preferably, the annealing is performed for between about 10 seconds and 3 minutes. According to one experiment, satisfactory results were achieved by annealing at 950° C. for 30 seconds with hydrogen gas flowing at 4 SLPM.

Figure 4:
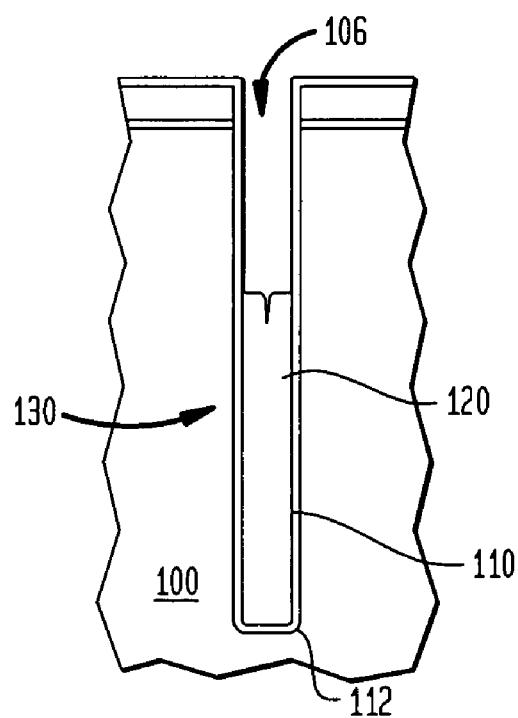
FIG. 4 is a schematic cross-sectional view illustrating a subsequent step in a process of eliminating a void according to one embodiment of the present invention.

The above-described annealing process substantially eliminates the V-shaped void 122 shown in FIG. 3, resulting in a a-Si or polysilicon filled trench resembling the trench shown in FIG. 4. This results in a substantially planar upper surface for the inner electrode 120. After the void has been eliminated or minimized by annealing, further processing, including, but not limited to, etching by RIE or wet etching may be performed on the trench capacitor 130, and the next deposition step to complete the electrode formation after collar structuring. Preferably, the annealing is carried out for a time and temperature sufficient to avoid recrystallization of the a-Si or polysilicon on the sidewalls of the trench.

Thus, according to one or more embodiments of the present invention, V-shaped void defects may be eliminated or minimized using a rapid and inexpensive annealing process. Elimination of such voids enables the fabrication of capacitors that do not exhibit increased resistance due to voids formed therein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of fabricating a semiconductor device, comprising:
   forming a trench having sidewalls in a semiconductor substrate having a top surface;
   depositing a layer of a-Si or polysilicon in the trench and in contact with said sidewalls;
   etching said a-Si polysilicon in said trench to a selected depth below said top surface; and
   annealing the a-Si or polysilicon layer in a hydrogen atmosphere subsequent to said etching to collapse any voids in the trench.

2. The method of claim 1, wherein the annealing avoids recrystallization of a-Si or polysilicon in the sidewalls.

3. The method of claim 2, wherein the annealing is performed at a temperature elevated from the temperature at which deposition of the a-Si or polysilicon occurs.

4. The method of claim 1, wherein the annealing is performed at a temperature greater than about 800° C.

5. The method of claim 4, wherein the annealing is performed at a temperature between about 850° C. to 950° C.

6. The method of claim 5, wherein the annealing is performed for less than about 5 minutes.

7. The method of claim 6, wherein the annealing is performed for less than about 3 minutes.

8. The method of claim 7, wherein the annealing is performed for between about 10 seconds and 3 minutes.

9. The method of claim 6, wherein the annealing is performed in an environment of flowing hydrogen.

10. The method of claim 9, wherein the hydrogen is flowed at a rate of between about two SLPM and 6 SLPM.

11. The method of claim 1, wherein the anneal is performed in an epitaxy reactor.

12. The method of claim 1, wherein the anneal is performed in a rapid thermal annealing reactor.

13. The method of claim 1, wherein the trench is a high aspect ratio trench.

14. The method of claim 13, wherein the trench has an aspect ratio greater than about 20.

15. A method of fabricating a semiconductor device, comprising:
   forming a trench having sidewalls in a semiconductor substrate having a top surface;
   depositing a layer of a-Si or polysilicon in the trench and in contact with said sidewalls;
   etching said a-Si or polysilicon layer in said trench to a selected depth below said top surface; and then
   flowing hydrogen in the trench at an elevated temperature in a manner to avoid recrystallization of a-Si or polysilicon in the sidewalls.

16. The method of claim 15, wherein hydrogen is flowed at a rate of between about 2 SLPM and 15 SLPM.

17. The method of claim 16, wherein the temperature is elevated and hydrogen is flowed for less than about 5 minutes.

18. The method of claim 17, wherein the temperature is elevated to above 900° C.

19. The method of claim 18, wherein the temperature is elevated for between about 10 seconds and 3 minutes.

20. A method of forming an electrode comprising:
   forming an outer electrode in a semiconductor substrate having a top surface;
   depositing a layer of a-Si or polysilicon on sidewalls of a trench formed in the semiconductor substrate;
   etching said a-Si or polysilicon layer in said trench to a selected depth below said top surface;
   exposing the etched a-Si or polysilicon to flowing hydrogen for less than about 5 minutes at a temperature elevated above the temperature at which the a-Si or polysilicon layer was deposited; and
   filling said trench above said etched a-Si polysilicon to form an inner electrode.

21. The method of claim 20, wherein the temperature at which the a-Si or polysilicon is exposed to hydrogen is between about 850° C. and 950° C.

22. The method of claim 1 and further comprising the step of filling said trench above said annealed a-Si or polysilicon layer to form an inner electrode.

23. The method of claim 15 and further comprising the step of filling said trench above said etched a-Si or polysilicon later to form an inner electrode.

* * * * *